United States Patent
Yamada

(10) Patent No.: US 11,847,281 B2
(45) Date of Patent: Dec. 19, 2023

(54) ELECTROSTATIC-CAPACITANCE DETECTION SENSOR

(71) Applicant: Alps Alpine Co., Ltd., Tokyo (JP)

(72) Inventor: Tomoki Yamada, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 265 days.

(21) Appl. No.: 17/518,388

(22) Filed: Nov. 3, 2021

(65) Prior Publication Data

US 2022/0057874 A1    Feb. 24, 2022

Related U.S. Application Data

(63) Continuation of application No. PCT/JP2020/011213, filed on Mar. 13, 2020.

(30) Foreign Application Priority Data

May 22, 2019   (JP) .................................. 2019-095930

(51) Int. Cl.
```
G01R 31/00      (2006.01)
G06F 3/044      (2006.01)
G01D 5/24       (2006.01)
G06F 3/041      (2006.01)
B62D 1/06       (2006.01)
```

(52) U.S. Cl.
CPC ............ *G06F 3/044* (2013.01); *G01D 5/2405* (2013.01); *G06F 3/0416* (2013.01); *B62D 1/06* (2013.01); *G06F 2203/04107* (2013.01); *G06F 2203/04108* (2013.01)

(58) Field of Classification Search
CPC ........................................................ G06F 3/044
USPC ........................................................ 324/547
See application file for complete search history.

(56) References Cited

U.S. PATENT DOCUMENTS

| | | |
|---|---|---|
| 2015/0002459 A1 | 1/2015 | Watanabe et al. |
| 2015/0330931 A1 | 11/2015 | Fujikawa et al. |
| 2021/0072048 A1* | 3/2021 | Sobukawa ......... G01R 27/2605 |

FOREIGN PATENT DOCUMENTS

| | | |
|---|---|---|
| JP | 2015-232542 | 12/2015 |
| JP | 6177026 | 7/2017 |

OTHER PUBLICATIONS

International Search Report from International Application No. PCT/JP2020/011213 dated Jun. 16, 2020.

* cited by examiner

*Primary Examiner* — Vincent Q Nguyen
(74) *Attorney, Agent, or Firm* — Beyer Law Group LLP

(57) ABSTRACT

A self-capacitance-system electrostatic-capacitance detection sensor includes a first electrode and a second electrode, one of the first and second electrodes being set as a sense electrode, and the other of the first and second electrodes being set as a drive electrode; a sense-signal generating unit that generates a sense signal to be applied to the sense electrode; a detecting unit that detects, as a detection value, an amount of charge movement corresponding to an electrostatic capacitance of the sense electrode; and a determining unit that determines whether or not a detection target is in close proximity to both the first and second electrodes, based on a subtraction difference between detection values detected by the detecting unit when a first drive signal is applied to the drive electrode and when a second drive signal having the same frequency and a different phase is applied to the drive electrode.

11 Claims, 14 Drawing Sheets

ELECTROSTATIC-CAPACITANCE DETECTION SENSOR

CLAIM OF PRIORITY

This application is a Continuation of International Application No. PCT/JP2020/011213 filed on Mar. 13, 2020, which claims benefit of Japanese Patent Application No. 2019-095930 filed on May 22, 2019. The entire contents of each application noted above are hereby incorporated by reference.

BACKGROUND OF THE INVENTION

1. Field of the Invention

The present disclosure relates to an electrostatic-capacitance detection sensor.

2. Description of the Related Art

In recent years, development of hands-on detection (HoD) sensors have been underway as technology related to automated (autonomous) driving. The HoD sensors perform, for example, holding-state sensing of steering wheels. For example, with an electrostatic-capacitance detection sensor, it can be determined that a steering wheel or the like is touched (held) when the value of a detected electrostatic capacitance or the like exceeds a certain reference value, and it can be determined that the steering wheel or the like is not touched (not held) when the value of the detected electrostatic capacitance or the like is smaller than or equal to the reference value.

Examples of the related art include Japanese Patent No. 6177026 and Japanese Unexamined Patent Application Publication No. 2015-232542.

However, with the related methods, for example, there are cases in which false detection occurs. Examples include a case in which even when a steering wheel or the like is held by a human hand, which is a detection target, it is determined that the steering wheel or the like is not held, and a case in which even when the steering wheel or the like is not held, it is determined that the steering wheel or the like is held. Thus, it is difficult to accurately determine whether or not a steering wheel or the like is held.

Thus, there are demands for electrostatic-capacitance detection sensors that can accurately determine whether or not a detection target is holding.

SUMMARY OF THE INVENTION

The present invention provides an electrostatic-capacitance detection sensor based on a self-capacitance system. The sensor includes: a first electrode and a second electrode, one of the first electrode and the second electrode being set as a sense electrode, and the other of the first electrode and the second electrode being set as a drive electrode; a sense-signal generating unit that generates a sense signal to be applied to the sense electrode; a detecting unit that detects, as a detection value, an amount of charge movement corresponding to an electrostatic capacitance of the sense electrode, when the sense-signal generating unit applies the sense signal to the sense electrode; and a determining unit that determines whether or not a detection target is in close proximity to both the first electrode and the second electrode, based on a subtraction difference between a first detection value detected by the detecting unit in a state in which a first drive signal is applied to the drive electrode and a second detection value detected by the detecting unit in a state in which a second drive signal that is same in frequency as the first drive signal and that is different in phase from the first drive signal is applied to the drive electrode.

According to the electrostatic-capacitance detection sensor in the present disclosure, it is possible to accurately determine whether or not a detection target is holding.

DESCRIPTION OF THE PREFERRED EMBODIMENTS

Figure 1:
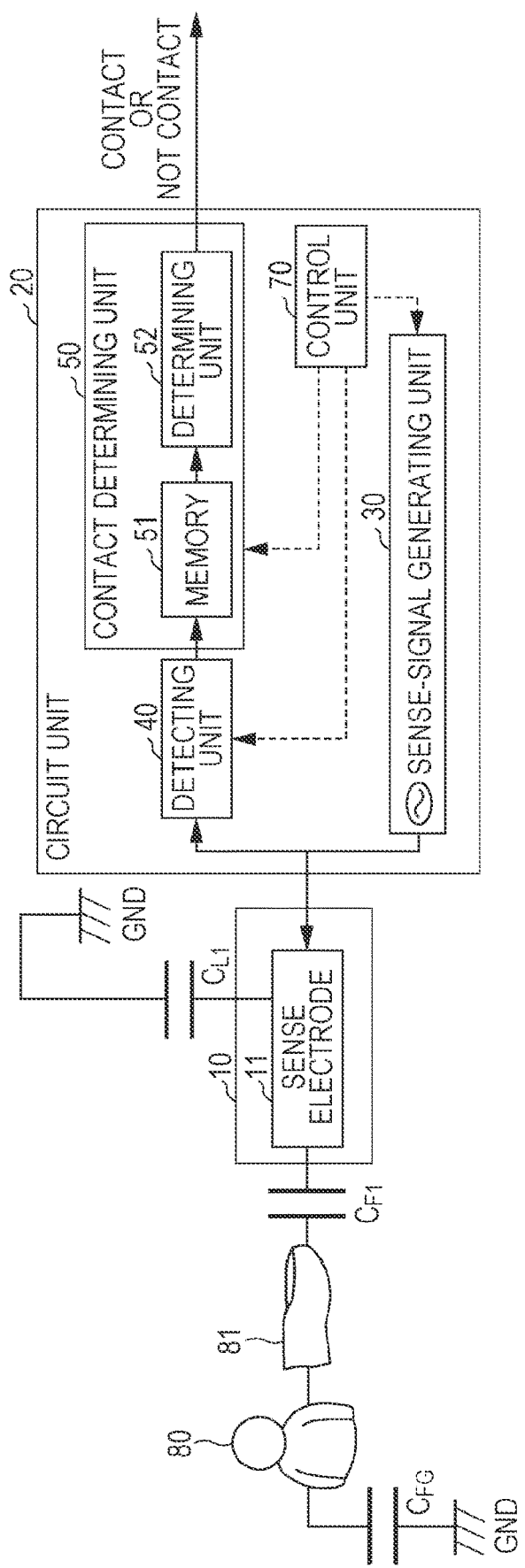
FIG. 1 is a structure diagram of a self-capacitance detection sensor.

Embodiments will be described below. The same members and so on are denoted by the same reference numerals, and descriptions thereof are not given hereinafter.

First, a case in which a self-capacitance-system electrostatic-capacitance detection sensor is used to perform detection will be described with reference to FIG. 1. The self-capacitance-system electrostatic-capacitance detection sensor illustrated in FIG. 1 includes a sensor unit 10, which has a sense electrode 11, and a circuit unit 20. The circuit unit 20 includes a sense-signal generating unit 30, a detecting unit 40, a contact determining unit 50, and a control unit 70. The contact determining unit 50 includes a memory 51 and a determining unit 52.

In this electrostatic-capacitance detection sensor, a leakage capacitance $C_{L1}$ occurs between the sense electrode 11 and ground GND, and an electrostatic capacitance $C_{F1}$ occurs between a part 81 of a human body 80 that is a detection target and the sense electrode 11. When the part 81 of the human body 80 comes close to the sense electrode 11, the value of the electrostatic capacitance $C_{F1}$ increases. Also, a coupling capacitance $C_{FG}$ occurs between the human body 80 and GND. The part 81 of the human body 80 is, for example, a finger or a palm.

In this electrostatic-capacitance detection sensor, the sense-signal generating unit 30 applies an alternating-current voltage to the sense electrode 11, and when the part 81 of the human body 80 comes close to the sense electrode 11, the value of the electrostatic capacitance $C_{F1}$ increases, and correspondingly, the amount of charge that moves, that is, the amount of charge movement, increases. The value of the amount of charge movement is detected by the detecting unit 40 and is stored in the memory 51. The determining unit 52 decides whether or not the value of the amount of charge movement, the value being detected by the detecting unit 40 and being stored in the memory 51, exceeds a predetermined threshold, to determine whether or not the part 81 of the human body 80 is in touch with the sensor unit 10. Specifically, the determining unit 52 determines that the part 81 of the human body 80 is in touch with the sensor unit 10 when the value of the amount of charge movement exceeds the predetermined threshold, determines that the part 81 of the human body 80 is not in touch with the sensor unit 10 when the value of the amount of charge movement does not exceed the predetermined threshold, and outputs contact or non-contact information. The control unit 70 controls the above-described series of electrostatic-capacitance detection operations.

In general, a portion that is included in the sensor unit 10 and that senses a contact is constituted by an insulator that covers the sense electrode 11. That is, when the part 81 of the human body 80 touches the sensor unit 10, the part 81 of the human body 80 is in close proximity to the sense electrode 11 with the insulator being interposed therebetween. In the present disclosure described below, similarly, a sense electrode and a drive electrode are provided at positions with an insulator being interposed therebetween, and it is assumed that a part of the human body does not directly touch the electrodes.

Meanwhile, in the case of the self-capacitance-system electrostatic-capacitance detection sensor illustrated in FIG. 1, false detection may occur since the electrostatic capacitance varies owing to a change in the environment, for example, a change in temperature or an external factor. Specifically, there is a case in which even when the part 81 of the human body 80 is not in touch with the sensor unit 10, the detecting unit 40 detects that the electrostatic capacitance is large, and the determining unit 52 determines that the part 81 of the human body 80 is in touch with the sensor unit 10, and there is also a case in which even when the part 81 of the human body 80 is in touch with the sensor unit 10, the detecting unit 40 detects that the electrostatic capacitance is small, and the determining unit 52 determines that the part 81 of the human body 80 is not in touch with the sensor unit 10.

Although various studies have been conducted on eliminating such false detection, false detection cannot be fully suppressed with any method. Thus, there are demands for an electrostatic-capacitance detection sensor without false detection.

First Embodiment

<Electrostatic-Capacitance Detection Sensor>

Figure 2:
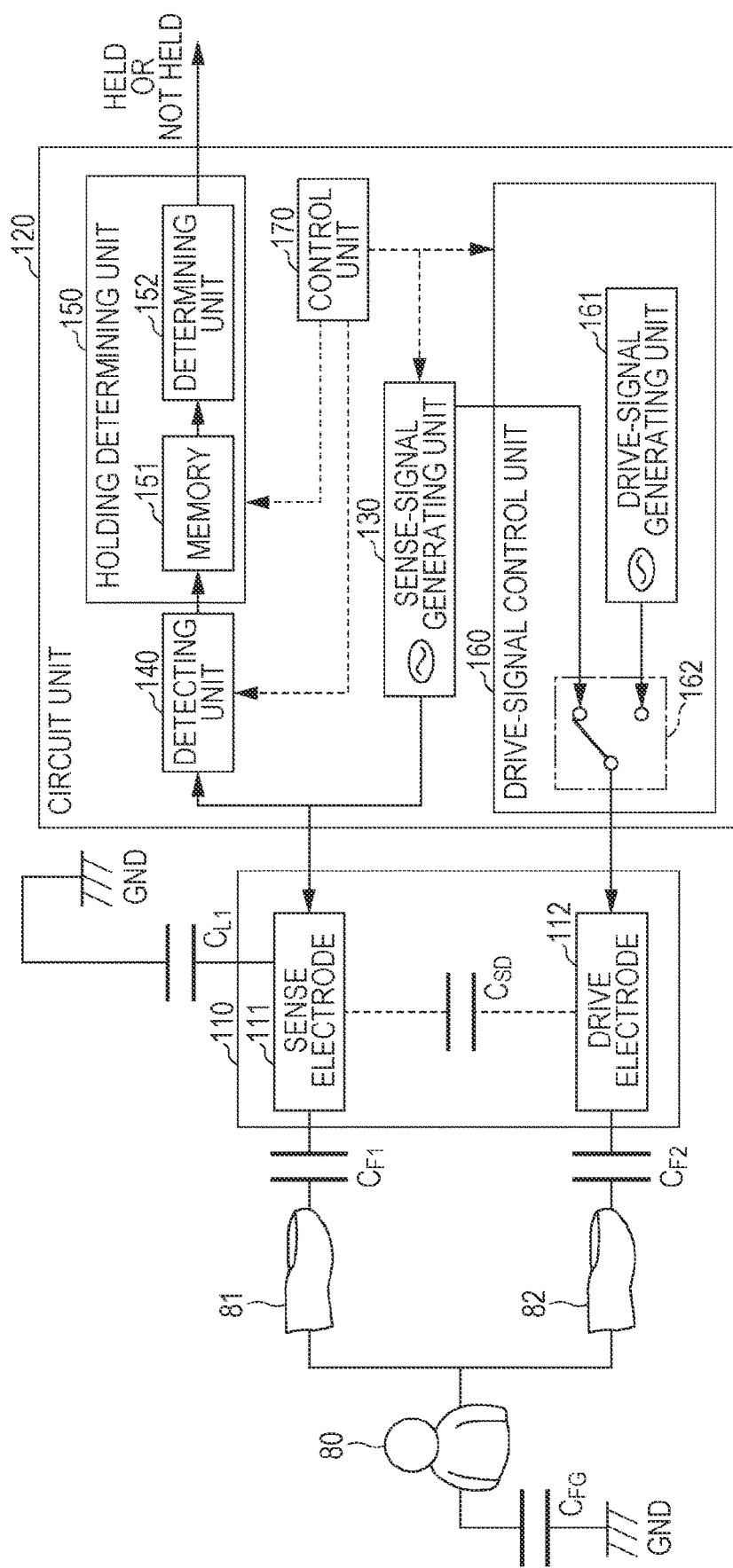
FIG. 2 is a structure diagram of an electrostatic-capacitance detection sensor according to a first embodiment.

Next, an electrostatic-capacitance detection sensor in a first embodiment will be described with reference to FIG. 2. The electrostatic-capacitance detection sensor in the present embodiment is a self-capacitance-system electrostatic-capacitance detection sensor and includes a sensor unit 110, which has a sense electrode 111 and a drive electrode 112, and a circuit unit 120. The electrostatic-capacitance detection sensor in the present embodiment is to determine whether or not predetermined portions of the sensor unit 110 are held by a human hand or the like. The circuit unit 120 includes a sense-signal generating unit 130, a detecting unit 140, a holding determining unit 150, a drive-signal control unit 160, and a control unit 170. The holding determining unit 150 includes a memory 151 and a determining unit 152. The drive-signal control unit 160 includes a drive-signal generating unit 161 and a switch 162, which is a selecting unit for selecting a signal to be applied to the drive electrode 112.

In the present disclosure, the sense electrode 111 and the drive electrode 112 may be respectively referred to as a "first electrode" and a "second electrode", in which case, one of the first electrode and the second electrode serves as the sense electrode 111, and the other serves as the drive electrode 112. In other words, the electrostatic-capacitance detection sensor in the present embodiment includes a first electrode and a second electrode. Also, the electrostatic-capacitance detection sensor may be provided with a plurality of sense electrodes 111 to select one thereof and may also be provided with a plurality of drive electrodes 112 to select one thereof. The electrostatic-capacitance detection sensor may be provided with three or more electrodes including the first electrode and the second electrode and may select the sense electrode and the drive electrode from the three or more electrodes.

In the electrostatic-capacitance detection sensor in the present embodiment, a leakage capacitance $C_{L1}$ occurs between the sense electrode 111 and GND, an electrostatic capacitance $C_{F1}$ occurs between a part 81 of a human body 80, which is a detection target, and the sense electrode 111, and when the part 81 of the human body 80 comes close to the sense electrode 111, the value of the electrostatic capacitance $C_{F1}$ increases. Also, an electrostatic capacitance $C_{F2}$ occurs between another part 82 of the human body 80 and the drive electrode 112, and when the other part 82 of the human body 80 comes close to the drive electrode 112, the value of the electrostatic capacitance $C_{F2}$ increases. In the present embodiment, since the electrostatic-capacitance detection sensor is to detect that the part 81 and the other part 82 of the same human body 80 are simultaneously in close proximity to the sense electrode 111 and the drive electrode 112, respectively, it is preferable that the distance between the sense electrode 111 and the drive electrode 112 be smaller than or equal to 1 m.

An electrostatic capacitance $C_{SD}$ occurs between the sense electrode 111 and the drive electrode 112, and since the present embodiment is based on the premise that charge of the drive electrode 112 influences the sense electrode 111 via the other part 82 of the human body 80, the human body 80, and the part 81 of the human body 80, it is referable that the value of the electrostatic capacitance $C_{SD}$ be as small as possible. In the description herein, the electrostatic capacitance $C_{SD}$ is assumed to be small and negligible.

In the electrostatic-capacitance detection sensor in the present embodiment, the sense-signal generating unit 130 generates a sense signal to be applied to the sense electrode 111 and applies the sense signal to the sense electrode 111 as an alternating-current voltage. Herein, when the part 81 of the human body 80 comes close to the sense electrode 111, the value of the electrostatic capacitance $C_{F1}$ increases, and correspondingly, the amount of charge movement increases. That is, when the sense-signal generating unit 130 applies the sense signal to the sense electrode 111, the detecting unit 140 detects, as a detection value, the amount of charge movement corresponding to an electrostatic capacitance of the sense electrode 111 and stores the detection value in the memory 151.

Based on the detection value stored in the memory 151, the determining unit 152 makes a determination as to holding and non-holding and performs outputting. Specifically, the determining unit 152 determines whether or not the detection target is in close proximity to both the first electrode and the second electrode, based on a subtraction difference between a first detection value detected by the detecting unit 140 in a state in which a first drive signal is applied to the drive electrode 112 and a second detection value detected by the detecting unit 140 in a state in which a second drive signal that is the same in frequency as the first drive signal and that is different in phase therefrom is applied to the drive electrode 112. Although a specific method is described later, the first drive signal is herein assumed to be the same as the sense signal. Also, the second drive signal is assumed to be the same as a drive signal generated by the drive-signal generating unit 161. The control unit 170 controls the above-described series of electrostatic-capacitance detection operations.

Also, the drive-signal control unit 160 selects the sense signal or the drive signal and applies the selected signal to the drive electrode 112. Specifically, the drive-signal generating unit 161 included in the drive-signal control unit 160 generates the drive signal. The switch 162 included in the drive-signal control unit 160 is connected to the drive electrode 112 and is also connected to the sense-signal generating unit 130 and the drive-signal generating unit 161. The switch 162 switches a connection target for the drive electrode 112 between the sense-signal generating unit 130 and the drive-signal generating unit 161 to thereby select the signal to be applied to the drive electrode 112. That is, the switch 162 included in the drive-signal control unit 160 selects the sense signal generated by the sense-signal generating unit 130 or the drive signal generated by the drive-signal generating unit 161 and outputs the selected signal to the drive electrode 112. That is, the sense-signal generating unit 130 is connected to the drive-signal control unit 160.

In the present embodiment, an alternating-current sense signal output from the sense-signal generating unit 130 and an alternating-current drive signal output from the drive-signal generating unit 161 are the same in frequency and are displaced in phase from each other by 180°. Although it is sufficient that the sense signal and the drive signal be displaced in at least phase from each other, a phase displacement of 180° increases the detection accuracy and is thus preferable.

<Detection Method>

Figure 3:
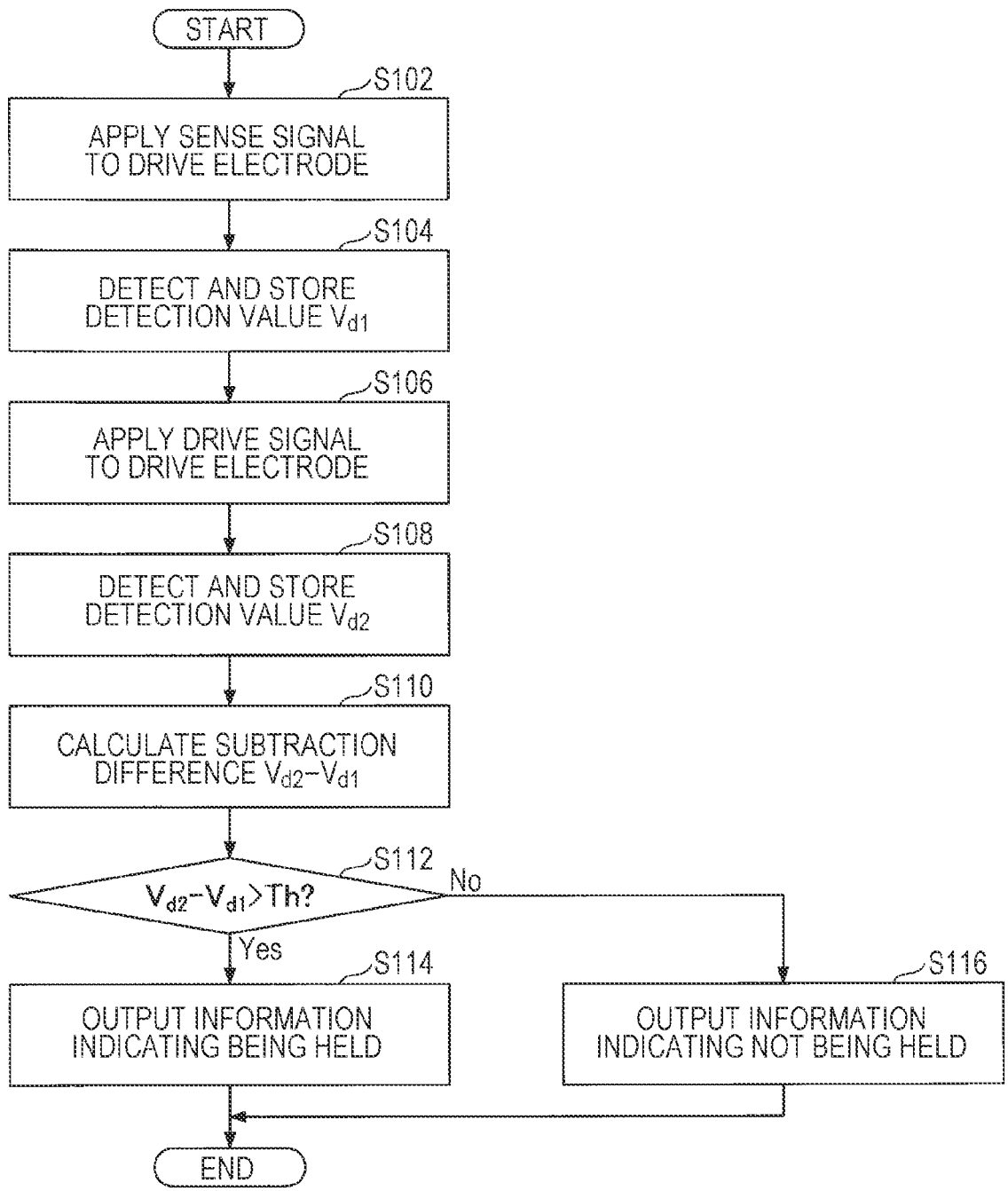
FIG. 3 is a flowchart of a detection method for the electrostatic-capacitance detection sensor in the first embodiment.

Next, a detection method in which the electrostatic-capacitance detection sensor in the present embodiment is used to determine whether or not the sensor unit 110 is held by a human hand or the like will be described with reference to FIG. 3.

First, in step 102 (S102), in a state which the sense signal generated by the sense-signal generating unit 130 is applied to the sense electrode 111, the circuit unit 120 also applies the sense signal to the drive electrode 112. Specifically, the sense-signal generating unit 130 generates the sense signal and applies the sense signal to the sense electrode 111. In this state, the switch 162 in the drive-signal control unit 160 connects the sense-signal generating unit 130 to the drive electrode 112 to thereby select the sense signal and applies the sense signal to the drive electrode 112. The control unit 170 controls the timing of these operations, the timing of detection by the detecting unit 140, and the timing of holding determination by the holding determining unit 150.

Next, in step 104 (S104), in the state in which the sense signal is applied to the sense electrode 111 and the drive electrode 112, the detecting unit 140 detects, as a detection value $V_{d1}$, the amount of charge movement corresponding to an electrostatic capacitance of the sense electrode 111 and stores the detection value $V_{d1}$ in the memory 151. This detection value $V_{d1}$ is a value as in expression (1):

$$V_{d1} \propto C_{L1} + \frac{C_{F1} \times C_{FG}}{C_{F1} + C_{F2} + C_{FG}} \qquad (1)$$

Next, in step 106 (S106), in the state in which the sense signal generated by the sense-signal generating unit 130 is applied to the sense electrode 111, the drive-signal control unit 160 applies the drive signal generated by the drive-signal generating unit 161 to the drive electrode 112. Specifically, in the state in which the sense signal generated by the sense-signal generating unit 130 is applied to the sense electrode 111, the switch 162 in the drive-signal control unit 160 connects the drive-signal generating unit 161 and the drive electrode 112 to thereby select the drive signal and applies the drive signal to the drive electrode 112.

Next, in step 108 (S108), in the state in which the sense signal is applied to the sense electrode 111, and the drive signal is applied to the drive electrode 112, the detecting unit 140 detects, as a detection value $V_{d2}$, the amount of charge movement corresponding to an electrostatic capacitance of the sense electrode 111 and stores the detection value $V_{d2}$ in the memory 151. This detection value $V_{d2}$ is a value as represented by expression (2).

$$V_{d2} \propto C_{L1} + \frac{C_{F1} \times C_{FG}}{C_{F1} + C_{F2} + C_{FG}} + 2 \times \frac{C_{F1} \times C_{F2}}{C_{F1} + C_{F2} + C_{FG}} \qquad (2)$$

Since the sense signal and the drive signal are opposite-phase signals that are displaced in phase from each other by 180°, the human body 80 is slightly shifted to an opposite phase via $C_{F2}$, and the detection value $V_{d2}$ becomes a value that is different from the detection value $V_{d1}$ represented by expression (1) noted above.

Next, in step 110 (S110), the determining unit 152 calculates a subtraction difference $V_{d2} - V_{d1}$ by using the detection values $V_{d1}$ and $V_{d2}$ stored in the memory 151. The subtraction difference $V_{d2} - V_{d1}$ that is calculated is a value as represented by expression (3):

$$V_{d2} - V_{d1} \propto 2 \times \frac{C_{F1} \times C_{F2}}{C_{F1} + C_{F2} + C_{FG}} \qquad (3)$$

The subtraction difference $V_{d2} - V_{d1}$ that is calculated is a value that is proportional to the product of the electrostatic capacitances $C_{F1}$ and $C_{F2}$, as represented by expression (3), and the value increases only when both the electrostatic capacitances CH and $C_{F2}$ are sufficiently large. Accordingly, when the part 81 of the human body 80 is in close proximity to only the sense electrode 111 or in close proximity to only the drive electrode 112, the value of the subtraction difference $V_{d2}$-$V_{d1}$ is significantly small. Hence, only when the part 81 of the human body 80 is in close proximity to both the sense electrode 111 and the drive electrode 112, that is, only when portions where the sense electrode 111 and the drive electrode 112 in the sensor unit 110 are provided are held by the part 81 of the human body 80, the value of the subtraction difference $V_{d2}$-$V_{d1}$ increases.

Self-capacitance-system electrostatic-capacitance detection sensors in related technologies typically do not include drive electrodes. However, although the electrostatic-capacitance detection sensor in the present disclosure is based on a self-capacitance system, it includes the drive electrode 112, which does not exist originally, sequentially applies two types of signal that are the same in frequency and that are different in phase to the drive electrode 112, and senses electrostatic capacitances of the sense electrode 111 in the respective cases in which the two types of signal are applied. Thus, the electrostatic-capacitance detection sensor has a great advantage in that it is possible to acquire values that are proportional to the product of the electrostatic capacitance $C_{F1}$ and the electrostatic capacitance $C_{F2}$.

Next, in step 112 (S112), the determining unit 152 decides whether or not the value of the subtraction difference $V_{d2}$-$V_{d1}$ is larger than a predetermined first threshold Th. When the value of the subtraction difference $V_{d2}$-$V_{d1}$ exceeds the predetermined first threshold Th, the determining unit 152 determines the detection target is in close proximity to both the first electrode (the sense electrode 111) and the second electrode (the drive electrode 112). That is, the flow proceeds to step 114 (S114) in which it is determined that the portions where the sense electrode 111 and the drive electrode 112 in the sensor unit 110 are provided are held, and the determining unit 152 outputs information indicating that the portions are held. Then, the processing ends. Also, when the value of the subtraction difference $V_{d2}$-$V_{d1}$ is smaller than or equal to the predetermined first threshold Th, the flow proceeds to step 116 (S116) in which it is determined that the portions where the sense electrode 111 and the drive electrode 112 in the sensor unit 110 are provided are not held, and the determining unit 152 outputs information indicating that the portions are not held. Then, the processing ends.

As described above, the value of the subtraction difference $V_{d2}$-$V_{d1}$ represented by expression (3) is significantly small when the detection target is in close proximity to only the sense electrode 111 or when the detection target is in close proximity to only the drive electrode 112, and the value of the subtraction difference $V_{d2}$-$V_{d1}$ increases only when the detection target is in close proximity to both the sense electrode 111 and the drive electrode 112, that is, only when the portions where the sense electrode 111 and the drive electrode 112 in the sensor unit 110 are provided are held by the part 81 of the human body 80. Thus, the determining unit 152 can accurately determine whether or not the portions where the sense electrode 111 and the drive electrode 112 in the sensor unit 110 are provided are held.

Also, since components of the leakage capacitance $C_{L1}$ whose numerical value varies depending on a temperature change or the like do not exist in the subtraction difference $V_{d2}$-$V_{d1}$ represented by expression (3), there is no dependency due to a change in the environment, such as a temperature. Thus, the predetermined first threshold Th does not need to be changed depending on the environment, such as a temperature, and thus can be fixed. Accordingly, even when a power supply of the electrostatic-capacitance detection sensor is turned on in a state in which predetermined portions of the sensor unit 110 are held, the determining unit 152 can determine that the portions where the sense electrode 111 and the drive electrode 112 in the sensor unit 110 are provided are held, when the value of the obtained subtraction difference $V_{d2}$-$V_{d1}$ exceeds the predetermined first threshold Th.

Figure 4:
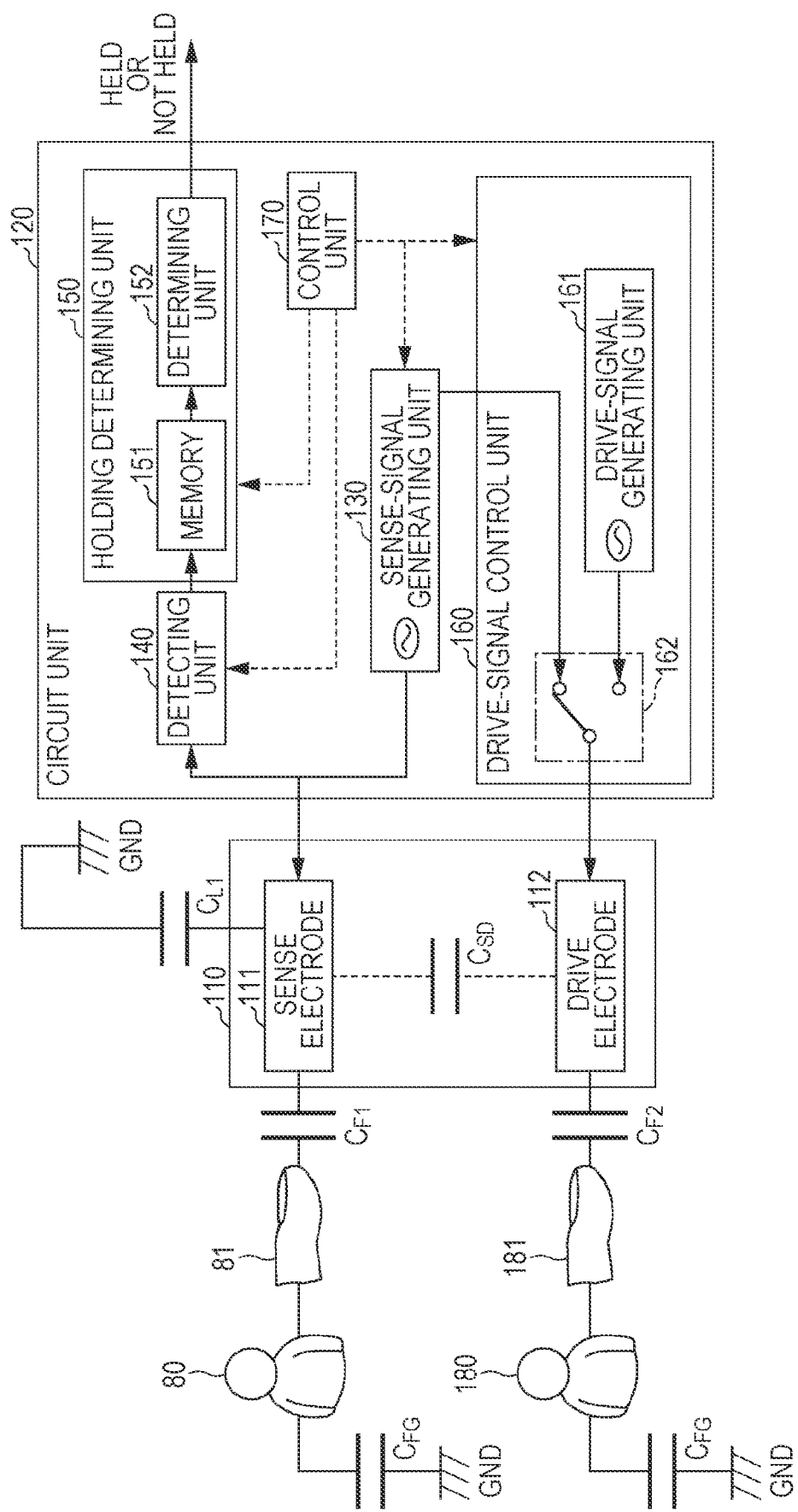
FIG. 4 is an explanatory diagram of the electrostatic-capacitance detection sensor in the first embodiment.

As illustrated in FIG. 4, when different human bodies are respectively in close proximity to the sense electrode 111 and the drive electrode 112 in the electrostatic-capacitance detection sensor in the present embodiment, the determining unit 152 does not determine that the portions where the sense electrode 111 and the drive electrode 112 in the sensor unit 110 are provided are held. Specifically, when the part 81 of the human body 80 is in close proximity to the sense electrode 111, and a part 181 of a human body 180 different from the human body 80 is in close proximity to the drive electrode 112, the human body 80 is not influenced by a change in the drive signal. Thus, the detection value $V_{d1}$ when the sense signal is applied to the drive electrode 112 and the detection value $V_{d2}$ when the drive signal is applied to the drive electrode 112 are the same value, the value of the subtraction difference $V_{d2}$-$V_{d1}$ is significantly small. Accordingly, the determining unit 152 does not determine that the portions where the sense electrode 111 and the drive electrode 112 in the sensor unit 110 are provided are not held.

Since this is based on the premise that the values of $C_{F1}$, $C_{F2}$, $C_{FG}$, and $C_{L1}$ do not change between a case in which the detection value $V_{d1}$ is detected and a case in which the detection value $V_{d2}$ is detected, it is preferable that the time from when the detection value $V_{d1}$ is detected until the detection value $V_{d2}$ is detected be as short as possible.

The denominator of the detection values $V_{d1}$ and $V_{d2}$ that are detected includes the coupling capacitance $C_{FG}$ between the human body and GND, and when the value of the coupling capacitance $C_{FG}$ is overwhelmingly large relative to the electrostatic capacitances $C_{F1}$ and $C_{F2}$ that occur due to the holding, there are cases in which the value of the subtraction difference $V_{d2}$-$V_{d1}$ does not increase.

<Experimental Result>

Figure 5:
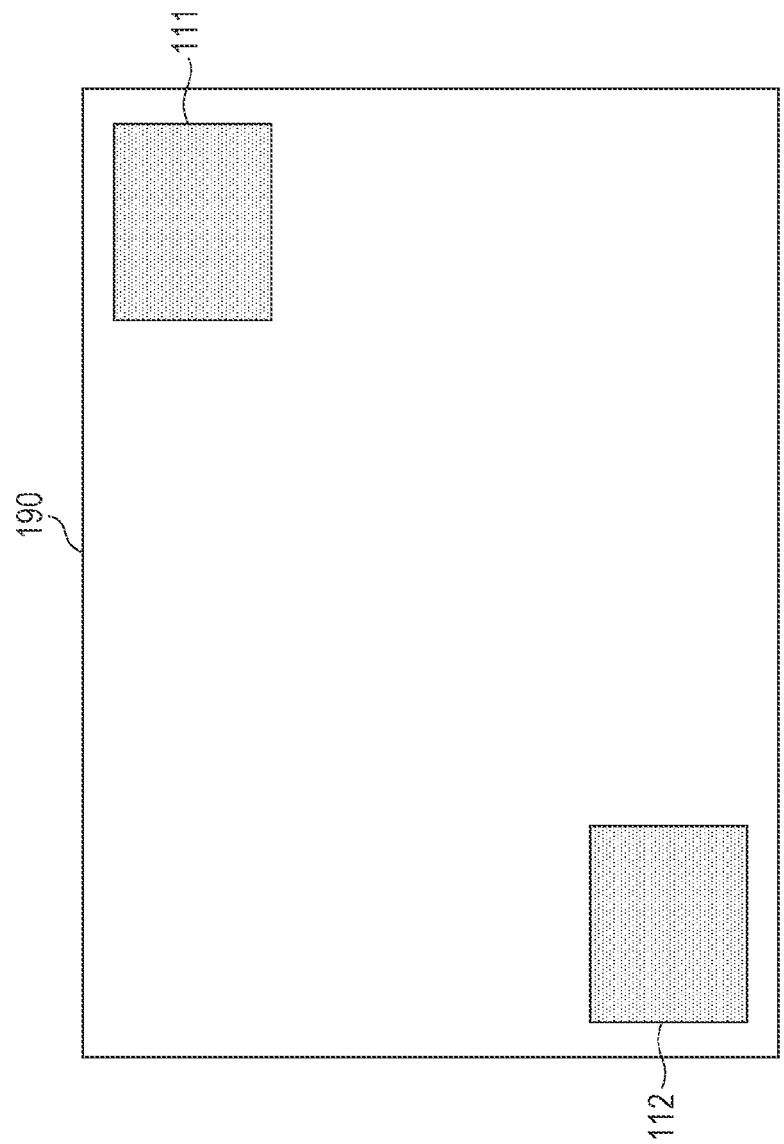
FIG. 5 is an explanatory diagram (1) of an experiment on the electrostatic-capacitance detection sensor in the first embodiment.

Next, an experiment performed using a test device in which the sense electrode 111 and the drive electrode 112 are provided on a surface of a substrate 190 as illustrated in FIG. 5 will be described with respect to the electrostatic-capacitance detection sensor in the present embodiment. However, in this test device, it is also assumed that the sense electrode 111 and the drive electrode 112 are covered by insulators, and the part 81 of the human body 80 does not directly contact the sense electrode 111 and the drive electrode 112.

Figure 6:
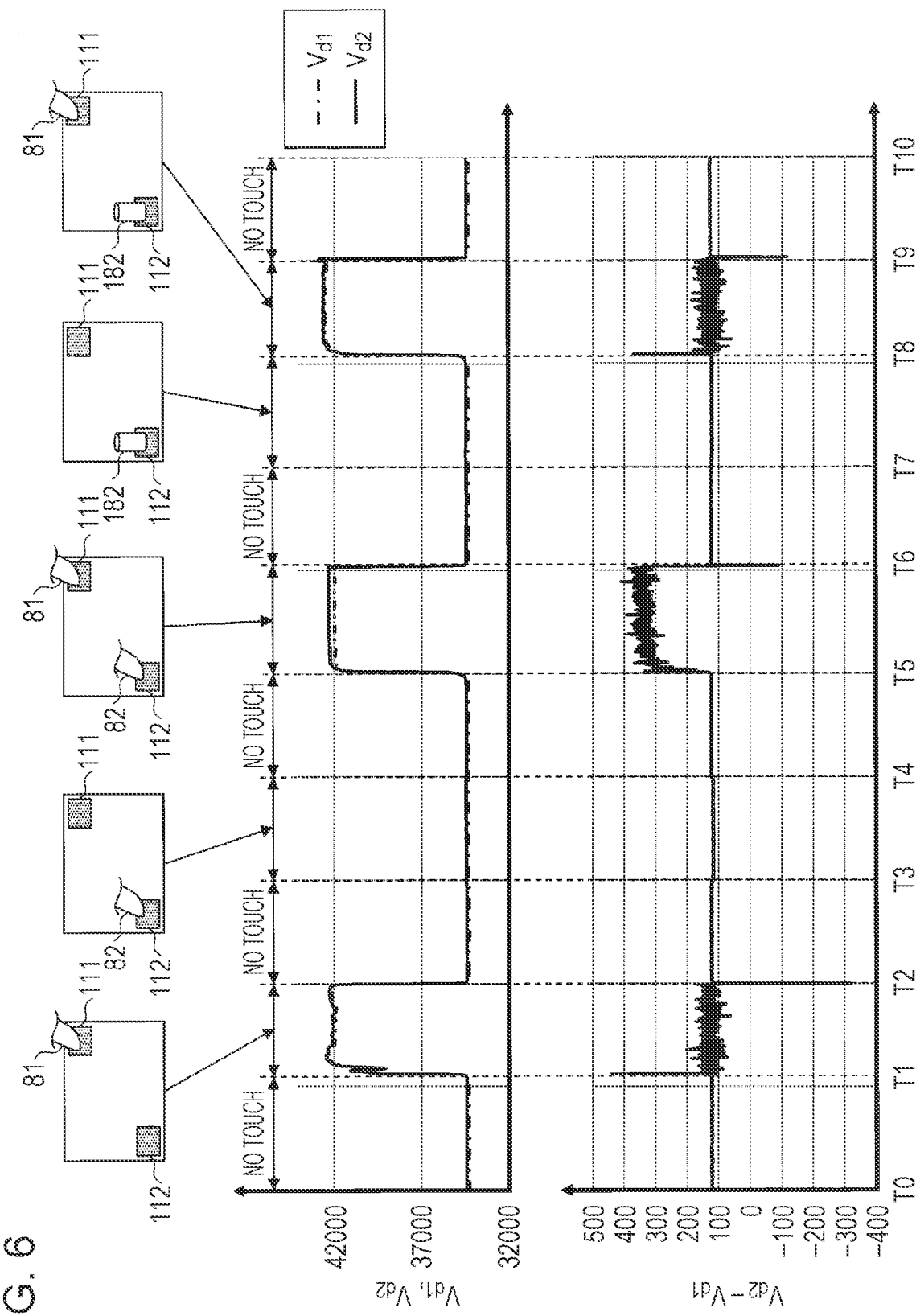
FIG. 6 is an explanatory diagram (2) of the experiment on the electrostatic-capacitance detection sensor in the first embodiment.

As illustrated in FIG. 6, in a period between time points T1 and T2, the part 81 of the human body 80 is in close proximity to the sense electrode 111, but nothing is in close proximity to the drive electrode 112. In this state, both the detection values $V_{d1}$ and $V_{d2}$ increase, but the detection values $V_{d1}$ and $V_{d2}$ are generally the same, and thus the value of the subtraction difference $V_{d2}$-$V_{d1}$ is a value close to 0.

In a period between time points T3 and T4, although nothing is in close proximity to the sense electrode 111, the other part 82 of the human body 80 is in close proximity to the drive electrode 112. In this state, since nothing is in close proximity to the sense electrode 111, neither of the detection values $V_{d1}$ and $V_{d2}$ changes, and hence, the value of the subtraction difference $V_{d2}-V_{d1}$ is generally 0.

In a period between time points T5 and T6, the part 81 of the human body 80 is in close proximity to the sense electrode 111, and the other part 82 of the same human body 80 is in close proximity to the drive electrode 112. In this state, although both the detection values $V_{d1}$ and $V_{d2}$ increase, the value of the subtraction difference $V_{d2}-V_{d1}$ increases greatly since the value of the detection value $V_{d2}$ is larger than the value of the detection value Val.

In a period between time points T7 and T8, although nothing is in close proximity to the sense electrode 111, a brazen bar 182, which is different from the human body 80, is in close proximity to the drive electrode 112. In this state, since nothing is in close proximity to the sense electrode 111, neither of the detection values $V_{d1}$ and $V_{d2}$ changes, and hence, the value of the subtraction difference $V_{d2}-V_{d1}$ reaches generally 0.

In a period between time points T8 and T9, the part 81 of the human body 80 is in close proximity to the sense electrode 111, and the brazen bar 182 is in close proximity to the drive electrode 112. In this state, the thing that is in close proximity to the drive electrode 112 is not another part or the like of the human body 80, and thus when the part 81 of the human body 80 comes in close proximity to the sense electrode 111, both the detection values $V_{d1}$ and $V_{d2}$ increase, but the value of the subtraction difference $V_{d2}-V_{d1}$ reaches a value that is close to 0, since the detection values $V_{d1}$ and $V_{d2}$ are generally the same.

In a period between time points T0 and T1, in a period between time points T2 and T3, in a period between time points T4 and T5, in a period between time points T6 and T7, and after time point T9, nothing is in close proximity to the sense electrode 111 and the drive electrode 112. In this state, since nothing is in close proximity to the sense electrode 111, both the detection values $V_{d1}$ and $V_{d2}$ do not change, and hence, the value of the subtraction difference $V_{d2}-V_{d1}$ is 0.

It is confirmed that, as described above, in a state in which the part 81 of the human body 80 is in close proximity to the sense electrode 111, and the other part 82 of the same human body 80 is in close proximity to the drive electrode 112, as in the period between time points T5 and T6, the value of the subtraction difference $V_{d2}-V_{d1}$ increases greatly. Although the value of the subtraction difference $V_{d2}-V_{d1}$ increases instantaneously at time points T1, T2, T6, T8, and T9, appropriately setting the length of the time for detection makes it possible to eliminate components for which the value of the subtraction difference $V_{d2}-V_{d1}$ increases instantaneously.

First Modification

Figure 7:
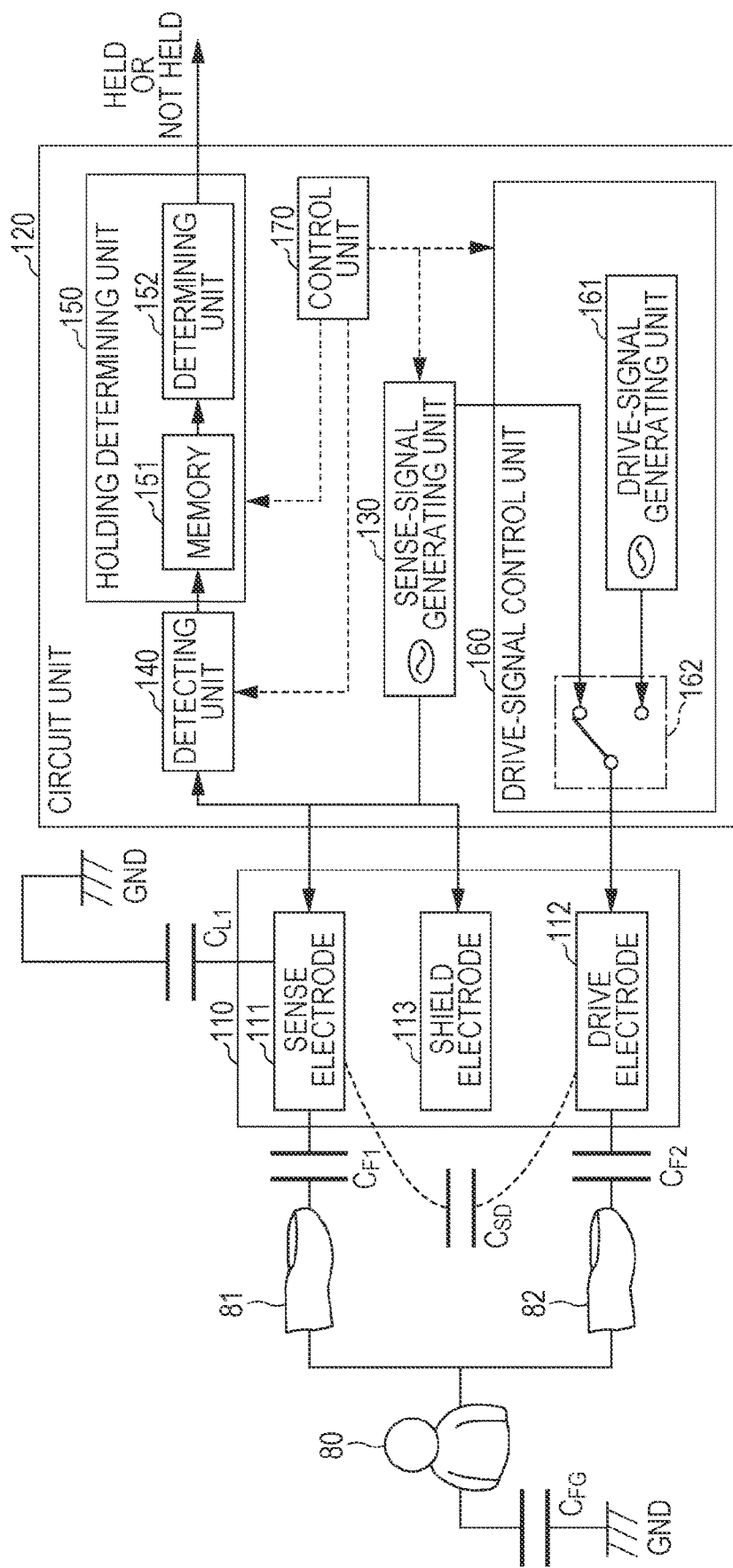
FIG. 7 is a structure diagram of a first modification of the electrostatic-capacitance detection sensor in the first embodiment.

Next, a first modification of the electrostatic-capacitance detection sensor in the present embodiment will be described with reference to FIG. 7. As illustrated in FIG. 7, in the electrostatic-capacitance detection sensor in this modification, a shield electrode 113 is provided between the sense electrode 111 and the drive electrode 112. This sense-signal generating unit 130 applies the sense signal (i.e., the first drive signal) to the shield electrode 113. This makes it possible to reduce the electrostatic capacitance $C_{SD}$ between the sense electrode 111 and the drive electrode 112.

Hence, it is preferable that this modification be applied to, for example, a case in which the value of the electrostatic capacitance $C_{SD}$ between the sense electrode 111 and the drive electrode 112 is not negligible.

Second Modification

Figure 8:
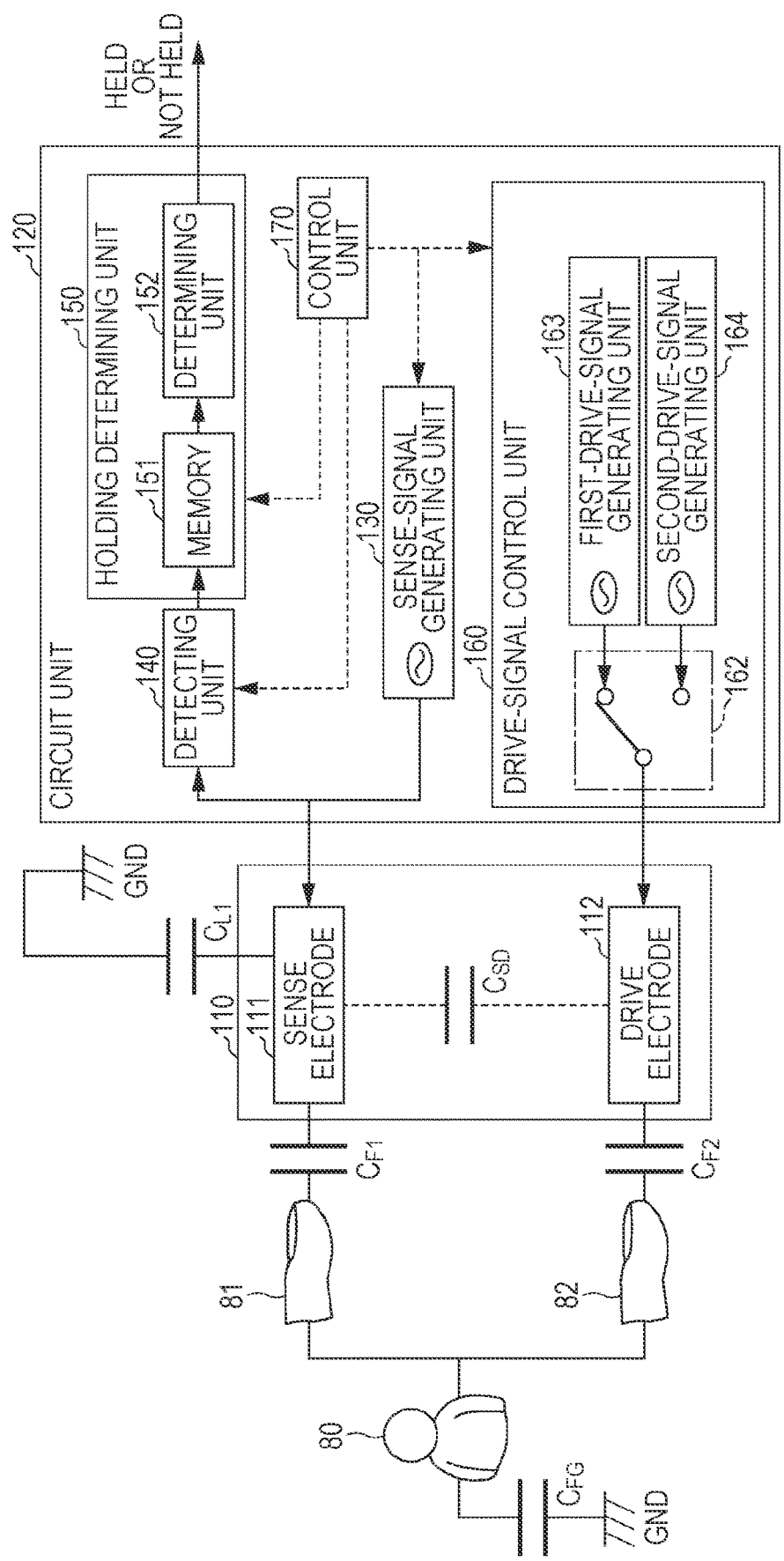
FIG. 8 is a structure diagram of a second modification of the electrostatic-capacitance detection sensor in the first embodiment.

Next, a second modification of the electrostatic-capacitance detection sensor in the present embodiment will be described with reference to FIG. 8. As illustrated in FIG. 8, in the electrostatic-capacitance detection sensor in this modification, a first-drive-signal generating unit 163 and a second-drive-signal generating unit 164 are provided in the drive-signal control unit 160 and are both connected to the switch 162. The first-drive-signal generating unit 163 generates the first drive signal. The second-drive-signal generating unit 164 generates the second drive signal. The switch 162 can select the first drive signal or the second drive signal and apply the selected drive signal to the drive electrode 112.

The first drive signal generated by the first-drive-signal generating unit 163 and the second drive signal generated by the second-drive-signal generating unit 164 are displaced in phase from each other by 180° and thus are opposite in phase. Although it is sufficient that the first drive signal and the second drive signal be displaced in at least phase from each other, a phase displacement of 180° increases the detection accuracy and is thus preferable.

In this modification, the sense-signal generating unit 130 is not connected to the drive-signal control unit 160. However, the sense signal generated by the sense-signal generating unit 130 and one of the first drive signal and the second drive signal may be the same signal. In this case, the first-drive-signal generating unit 163 can be omitted with a configuration in which the sense-signal generating unit 130 and the drive-signal control unit 160 are connected as illustrated in FIG. 2. In this case, the second-drive-signal generating unit 164 corresponds to the drive-signal generating unit 161 described above.

Second Embodiment

Figure 9:
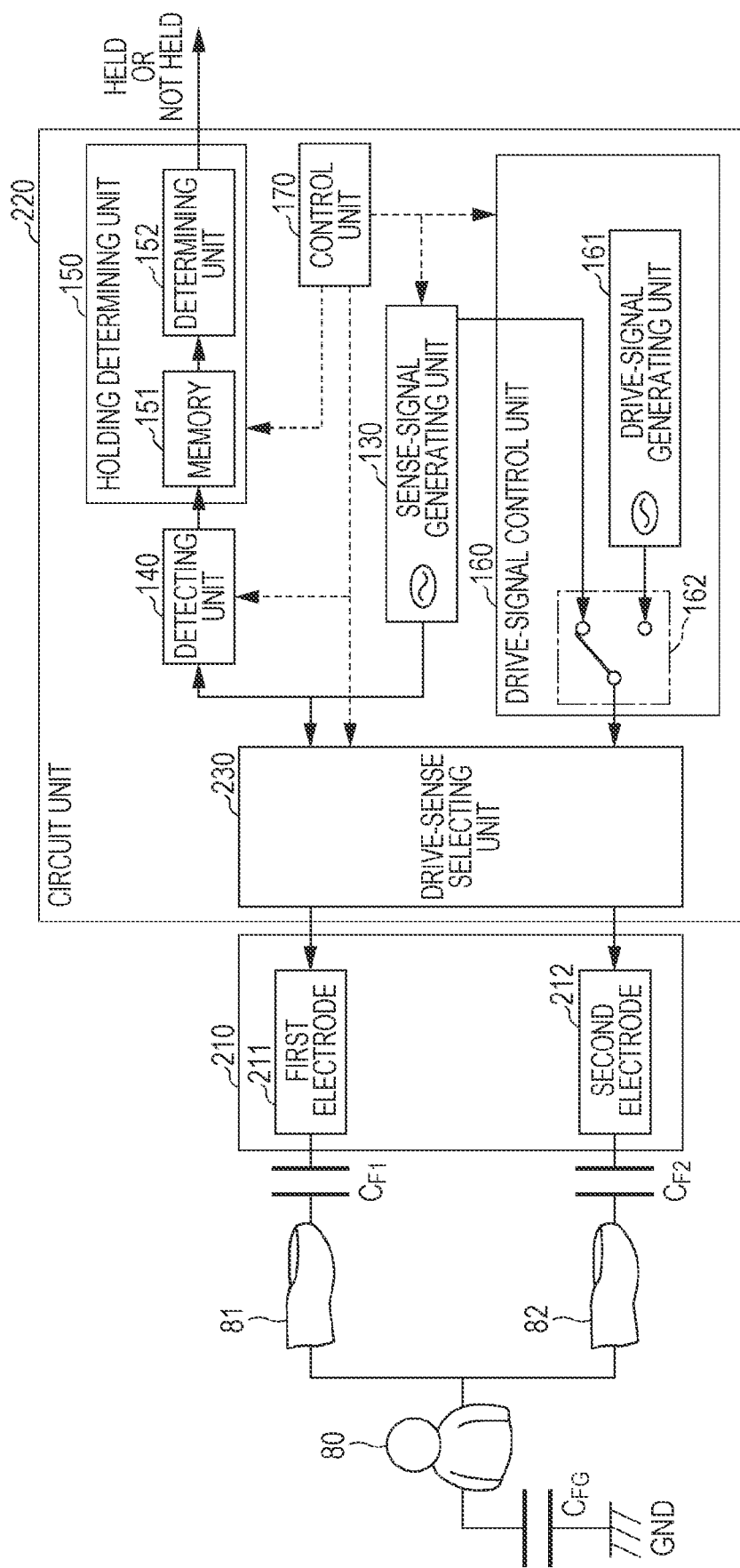
FIG. 9 is a structure diagram of an electrostatic-capacitance detection sensor in a second embodiment.

Next, in an electrostatic-capacitance detection sensor in a second embodiment, a sensor unit 210 includes a first electrode 211 and a second electrode 212, as illustrated in FIG. 9. In the present embodiment, one of the first electrode 211 and the second electrode 212 serves as the sense electrode, and the other electrode serves as the drive electrode.

A circuit unit 220 includes the sense-signal generating unit 130, the detecting unit 140, the holding determining unit 150, the drive-signal control unit 160, the control unit 170, and a drive-sense selecting unit 230. Also, the holding determining unit 150 includes the memory 151 and the determining unit 152. The drive-sense selecting unit 230 sets one of the first electrode 211 and the second electrode as the sense electrode and sets the other electrode as the drive electrode. That is, the drive-sense selecting unit 230 can select between a case in which the sense-signal generating unit 130 and the drive-signal control unit 160 are parallel-connected with the first electrode 211 and the second electrode 212 and a case in which the sense-signal generating unit 130 and the drive-signal control unit 160 are cross-connected with the first electrode 211 and the second electrode 212.

Figure 10:
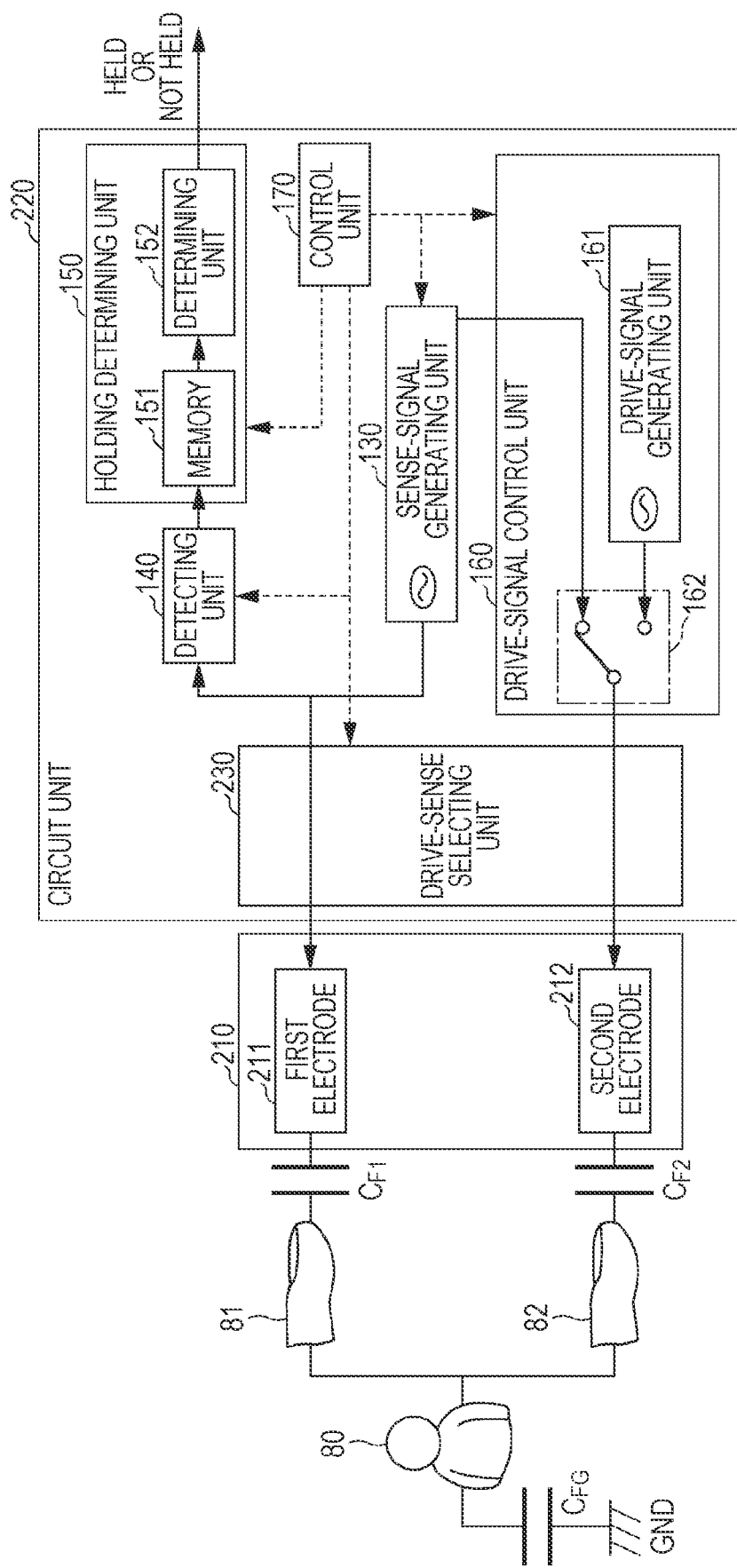
FIG. 10 is a structure diagram (1) of the electrostatic-capacitance detection sensor in the second embodiment.

In the drive-sense selecting unit 230, when the parallel connection is performed, the first electrode 211 and the sense-signal generating unit 130 are connected to each other, and the second electrode 212 and the drive-signal control unit 160 are connected to each other, as illustrated in FIG. 10. In this case, the first electrode 211 serves as the sense electrode, and the second electrode 212 serves as the drive electrode.

Figure 11:
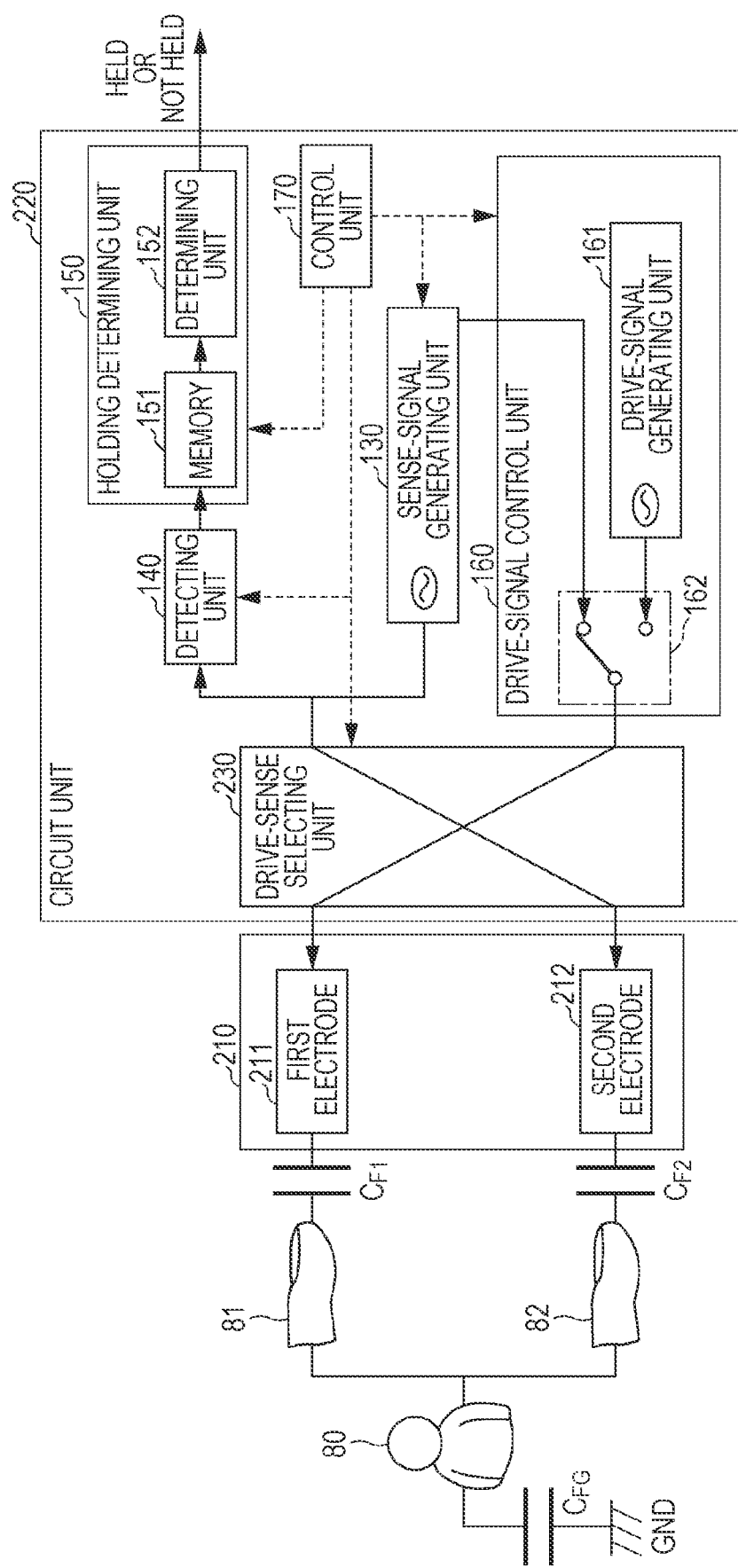
FIG. 11 is a structure diagram (2) of the electrostatic-capacitance detection sensor in the second embodiment.

Also, in the drive-sense selecting unit 230, when the cross connection is performed, the first electrode 211 and the drive-signal control unit 160 are connected to each other, and the second electrode 212 and the sense-signal generating unit 130 are connected to each other, as illustrated in FIG. 11. In this case, the first electrode 211 serves as the drive electrode, and the second electrode 212 serves as the sense electrode.

In the present embodiment, since the drive-sense selecting unit 230 switches between the sense electrode and the drive electrode at the first electrode 211 and the second electrode 212, the electrostatic-capacitance detection sensor in the present embodiment can improve the accuracy of the determination that the determining unit 152 makes as to whether or not the portions where the sense electrode 111 and the drive electrode 112 in the sensor unit 110 are provided are held.

As in the first embodiment, the determining unit 152 determines whether or not a detection target is in close proximity to both the first electrode and the second electrode, based on a subtraction difference between a first detection value detected by the detecting unit 140 in a state in which a first drive signal is applied to the drive electrode and a second detection value detected by the detecting unit 140 in a state in which a second drive signal that is the same in frequency as the first drive signal and that is different in phase from the first drive signal is applied to the drive electrode. Although a specific method is described later, the first drive signal in this case is assumed to be the same as the sense signal generated by the sense-signal generating unit 130. Also, the second drive signal is assumed to be the same as the drive signal generated by the drive-signal generating unit 161.

In addition, when a difference between a value of the subtraction difference obtained in a state in which the first electrode 211 is set as the sense electrode and the second electrode 212 is set as the drive electrode and a value of the subtraction difference obtained in a state in which the second electrode 212 is set as the sense electrode and the first electrode 211 is set as the drive electrode is smaller than or equal to a predetermined second threshold, the determining unit 152 determines that the detection target is in close proximity to both the first electrode 211 and the second electrode 212.

<Detection Method>

Figure 12:
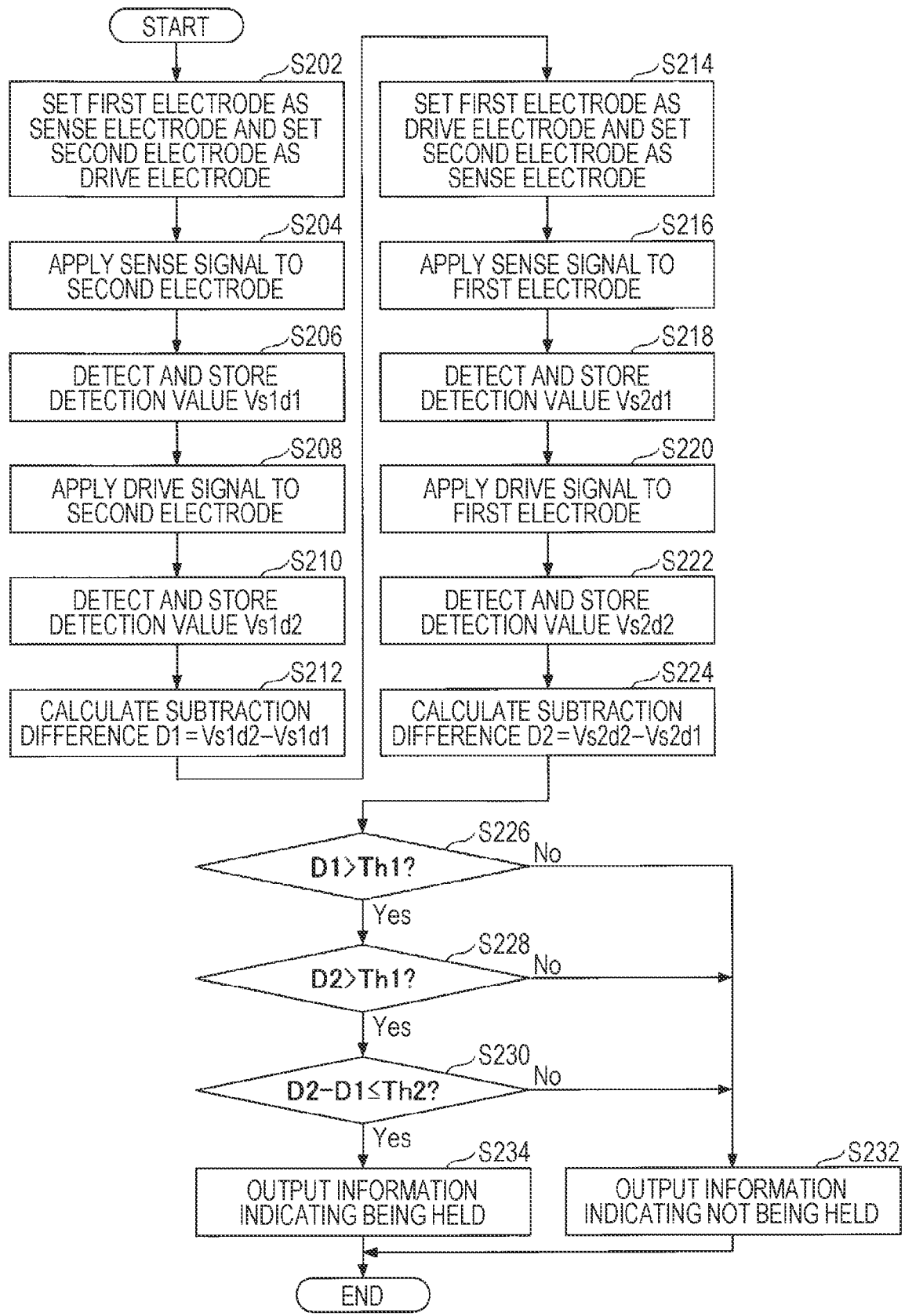
FIG. 12 is a flowchart of a detection method for the electrostatic-capacitance detection sensor in the second embodiment.

Next, a detection method in which the electrostatic-capacitance detection sensor in the present embodiment is used to determine whether or not the sensor unit 210 is held by a human hand or the like will be described with reference to FIG. 12. The sense signal and the drive signal are opposite-phase signals that are displaced in phase from each other by 180°.

First, in step 202 (S202), the drive-sense selecting unit 230 performs the parallel connection, that is, connects the first electrode 211 and the sense-signal generating unit 130 and connects the second electrode 212 and the drive-signal control unit 160, as illustrated in FIG. 10. As a result, the first electrode 211 serves as the sense electrode, and the second electrode 212 serves as the drive electrode.

Next, in step 204 (S204), in a state in which the sense signal generated by the sense-signal generating unit 130 is applied to the first electrode 211, which serves as the sense electrode, the drive-signal control unit 160 also applies the sense signal to the second electrode 212, which serves as the drive electrode. Specifically, in the state in which the sense signal generated by the sense-signal generating unit 130 is applied to the first electrode 211, the switch 162 in the drive-signal control unit 160 connects the sense-signal generating unit 130 and the second electrode 212 to thereby apply the sense signal to the second electrode 212.

Next, in step 206 (S206), in the state in which the sense signal is applied to the first electrode 211 and the second electrode 212, the detecting unit 140 detects, as a detection value Vs1$d$1, the amount of charge movement corresponding to an electrostatic capacitance of the first electrode 211, which is the sense electrode, and stores the detection value Vs1$d$1 in the memory 151.

Next, in step 208 (S208), in the state in which the sense signal generated by the sense-signal generating unit 130 is applied to the first electrode 211, which serves as the sense electrode, the drive-signal control unit 160 applies the drive signal generated by the drive-signal generating unit 161 to the second electrode 212, which serves as the drive electrode. Specifically, in the state in which the sense signal generated by the sense-signal generating unit 130 is applied to the first electrode 211, the switch 162 in the drive-signal control unit 160 connects the drive-signal generating unit 161 and the second electrode 212 to thereby apply the drive signal to the second electrode 212.

Next, in step 210 (S210), in the state in which the sense signal is applied to the first electrode 211, and the drive signal is applied to the second electrode 212, the detecting unit 140 detects, as a detection value Vs1$d$2, the amount of charge movement corresponding to an electrostatic capacitance of the first electrode 211, which is the sense electrode, and stores the detection value Vs1$d$2 in the memory 151.

Next, in step 212 (S212), the determining unit 152 calculates a subtraction difference D1=Vs1$d$2−Vs1$d$1 by using the detection values Vs1$d$1 and Vs1$d$2 stored in the memory 151.

Next, in step 214 (S214), the drive-sense selecting unit 230 performs the cross connection, that is, connects the first electrode 211 and the drive-signal control unit 160 and connects the second electrode 212 and the sense-signal generating unit 130, as illustrated in FIG. 11. As a result, the first electrode 211 serves as the drive electrode, and the second electrode 212 serves as the sense electrode.

Next, in step 216 (S216), in a state in which the sense signal generated by the sense-signal generating unit 130 is applied to the second electrode 212, which serves as the sense electrode, the drive-signal control unit 160 applies the sense signal to the first electrode 211, which serves as the drive electrode. Specifically, in the state in which the sense signal generated by the sense-signal generating unit 130 is applied to the second electrode 212, the switch 162 in the drive-signal control unit 160 connects the sense-signal generating unit 130 and the first electrode 211 to thereby apply the sense signal to the first electrode 211.

Next, in step 218 (S218), in the state in which the sense signal is applied to the first electrode 211 and the second electrode 212, the detecting unit 140 detects, as a detection value Vs2$d$1, the amount of charge movement corresponding to an electrostatic capacitance of the second electrode 212, which is the sense electrode, and stores the detection value Vs2$d$1 in the memory 151.

Next, in step 220 (S220), in the state in which the sense signal generated by the sense-signal generating unit 130 is applied to the second electrode 212, which serves as the sense electrode, the drive-signal control unit 160 applies the drive signal generated by the drive-signal generating unit 161 to the first electrode 211, which serves as the drive electrode. Specifically, in the state in which the sense signal generated by the sense-signal generating unit 130 is applied to the second electrode 212, the switch 162 in the drive-signal control unit 160 connects the drive-signal generating unit 161 and the first electrode 211 to apply the drive signal to the first electrode 211.

Next, in step 222 (S222), in the state in which the sense signal is applied to the second electrode 212, and the drive signal is applied to the first electrode 211, the detecting unit 140 detects, as a detection value Vs2d2, the amount of charge movement corresponding to an electrostatic capacitance of the second electrode 212, which is the sense electrode, and stores the detection value Vs2d2 in the memory 151.

Next, in step 224 (S224), the determining unit 152 calculates a subtraction difference D2=Vs2d2-Vs2d1 by using the detection values Vs2d1 and Vs2d2 stored in the memory 151.

Next, in step 226 (S226), the determining unit 152 decides whether or not the value of the subtraction difference D1 is larger than a predetermined first threshold Th1. When the value of the subtraction difference D1 is larger than the predetermined first threshold Th1, the flow proceeds to step 228, and when the value of the subtraction difference D1 is smaller than or equal to the predetermined first threshold Th1, the flow proceeds to step 232.

In step 228 (S228), the determining unit 152 decides whether or not the value of the subtraction difference D2 is larger than the predetermined first threshold Th1. When the value of the subtraction difference D2 is larger than the predetermined first threshold Th1, the flow proceeds to step 230, and when the value of the subtraction difference D2 is smaller than or equal to the predetermined first threshold Th1, the flow proceeds to step 232.

In step 230 (S230), the determining unit 152 decides whether or not the value of D2−D1 is smaller than or equal to a predetermined second threshold Th2. When the value of D2−D1 is smaller than or equal to the predetermined second threshold Th2, the flow proceeds to step 234, and when the value of D2−D1 is larger than the predetermined second threshold Th2, the flow proceeds to step 232.

In step 232 (S232), the determining unit 152 determines that the portions where the first electrode 211 and the second electrode 212 in the sensor unit 210 are provided are not held, outputs information indicating that the portions are not held. Then, the processing ends. In step 234 (S234), the determining unit 152 determines that the detection target is in close proximity to both the first electrode 211 and the second electrode 212. That is, the determining unit 152 determines that the portions where the first electrode 211 and the second electrode 212 in the sensor unit 210 are provided are held, outputs information indicating that the portions are held. Then, the processing ends.

The electrostatic-capacitance detection sensor in the present embodiment can suppress false detection due to influences of noise and so on, by interchanging between the sense electrode and the drive electrode at the first electrode 211 and the second electrode 212. The value of the subtraction difference D1 and the value of the subtraction difference D2 are values proportional to the value of the right-hand side of expression (3) and are essentially the same values even when the sense electrode and the drive electrode are interchanged. Although there is a possibility that the value of the subtraction difference D1 or the value of the subtraction difference D2 becomes a large value instantaneously owing to influences of noise and so on, there is a significantly low probability that both the value of the subtraction difference D1 and the value of the subtraction difference D2 become large values and become generally the same.

Accordingly, when the value of the subtraction difference D1 or the value of the subtraction difference D2 becomes a large value instantaneously owing to influences of noise and so on, the value of D2−D1 becomes larger than the predetermined second threshold Th2. Thus, without being misled by influences of noise and so on, the determining unit 152 determines that the portions where the first electrode 211 and the second electrode 212 in the sensor unit 210 are provided are not held, thus making it possible to improve the detection accuracy.

Contents other than those described above are analogous to those in the first embodiment.

Third Embodiment

Figure 13:
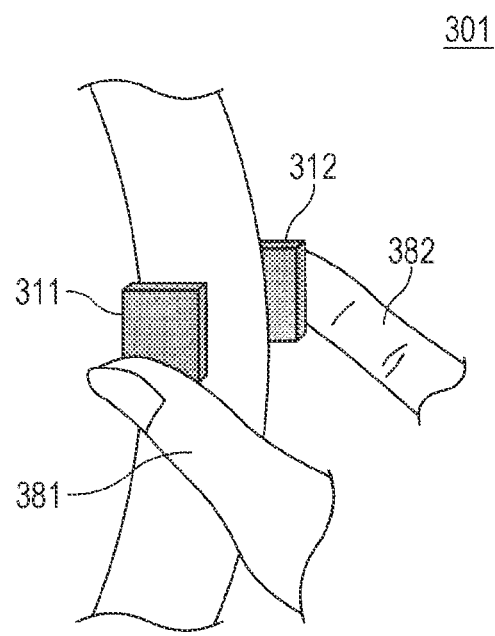
FIG. 13 is an explanatory diagram of a steering wheel in a third embodiment.

Next, a third embodiment will be described. The present embodiment is directed to a steering wheel, a door handle, a smartphone, and so on using the electrostatic-capacitance detection sensor in the first or second embodiment. A first electrode 311 is attached to a near side of a steering wheel 301 in the present embodiment, and a second electrode 312 is attached to a far side thereof, as illustrated in FIG. 13, and for example, when the steering wheel 301 is held, it is detected that a thumb 381 of a human body is in close proximity to the first electrode 311, and an index finger 382 thereof is in close proximity to the second electrode 312. This makes it possible to accurately make a determination as to holding the steering wheel 301.

In the electrostatic-capacitance detection sensor in the first embodiment, one of the first electrode 311 and the second electrode 312 corresponds to the sense electrode 111, and the other electrode corresponds to the drive electrode 112. In the electrostatic-capacitance detection sensor in the second embodiment, the first electrode 311 corresponds to the first electrode 211, and the second electrode 312 corresponds to the second electrode 212.

Figure 14:
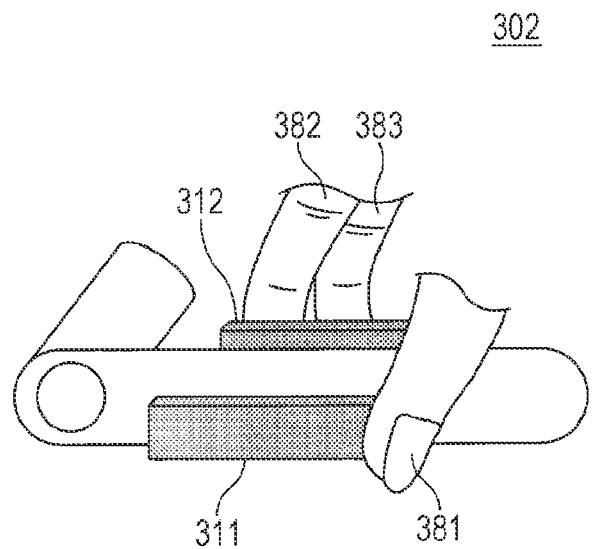
FIG. 14 is an explanatory diagram of a door handle in the third embodiment.
Figure 15:
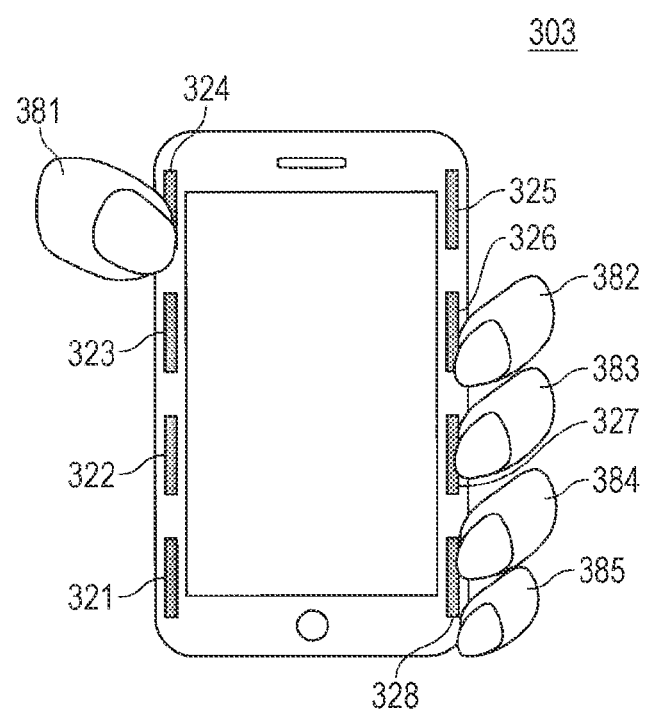
FIG. 15 is an explanatory diagram of a smartphone in the third embodiment.

Also, the first electrode 311 is attached to a near side of a door handle 302 in the present embodiment, and the second electrode 312 is attached to a far side thereof, as illustrated in FIG. 14, and for example, when the door handle 302 is held, it is detected that a thumb 381 of a human body is in close proximity to the first electrode 311, and a finger, such as an index finger 382 or a middle finger 383, other than the thumb 381 is in close proximity to the second electrode 312. This makes it possible to accurately make a determination as to holding the door handle 302.

Also, electrodes 321, 322, 323, and 324 are attached to the vicinity of a side surface at the left side of a smartphone 303 in the present embodiment, electrodes 325, 326, 327, and 328 are attached to a side surface at the right side thereof. The sense electrode and the drive electrode are selected from the electrodes 321, 322, 323, 324, 325, 326, 327, and 328 to sense that any of a thumb 381, an index finger 382, a middle finger 383, a ring finger 384, and a little finger 385 of a human body are in close proximity to both the selected electrodes. This makes it possible to accurately make a determination as to holding the smartphone 303.

Although embodiments have been described above in detail, the disclosure is not limited to the particular embodiments, and various modifications and changes can be made within the scope recited in the claims.

What is claimed is:

1. An electrostatic-capacitance detection sensor based on a self-capacitance system, the sensor comprising:
a first electrode and a second electrode, one of the first electrode and the second electrode being set as a sense electrode, and the other of the first electrode and the second electrode being set as a drive electrode;

a sense-signal generating unit configured to generate a sense signal to be applied to the sense electrode;

a detecting unit configured to detect, as a detection value, an amount of electric charge transfer corresponding to an electrostatic capacitance of the sense electrode, when the sense signal is applied to the sense electrode from the sense-signal generating unit; and a determining unit configured to determine whether or not a detection target is in close proximity to both of the first electrode and the second electrode, based on a subtraction difference between a first detection value detected by the detecting unit in a state in which a first drive signal is being applied to the drive electrode, and a second detection value detected by the detecting unit in a state in which a second drive signal is being applied to the drive electrode, wherein the second drive signal is the same in frequency as the first drive signal and is different in phase from the first drive signal.

2. The electrostatic-capacitance detection sensor according to claim 1,
wherein the first drive signal is the same as the sense signal, and the second drive signal is a drive signal;
wherein the electrostatic-capacitance detection sensor further comprises a drive-signal control unit that selects one of the sense signal and the drive signal, and applies the selected signal to the drive electrode; and
wherein the drive-signal control unit includes:
a drive-signal generating unit configured to generate the drive signals; and
a selecting unit connected to the sense-signal generating unit and the drive-signal generating unit, and configured to select one of the sense signal and the drive signal.

3. The electrostatic-capacitance detection sensor according to claim 1, further comprising:
a drive-signal control unit configured to select one of the first drive signal and the second drive signal as a drive signal, and to apply the selected drive signal to the drive electrode,
wherein the drive-signal control unit includes:
a first-drive-signal generating unit configured to generate the first drive signals;
a second-drive-signal generating unit configured to generate the second drive signals; and
a selecting unit configured to select one of the first drive signal and the second drive signal.

4. The electrostatic-capacitance detection sensor according to claim 1,
wherein, when a value of the subtraction difference exceeds a predetermined first threshold, the determining unit determines that a detection target is in close proximity to both of the first electrode and the second electrode.

5. The electrostatic-capacitance detection sensor according to claim 1, further comprising:
a shield electrode provided between the sense electrode and the drive electrode, the sense signal being applied to the shield electrode.

6. The electrostatic-capacitance detection sensor according to claim 1,
wherein the first drive signal and the second drive signal are displaced in phase from each other by 180°.

7. The electrostatic-capacitance detection sensor according to claim 1,
wherein a distance between the sense electrode and the drive electrode is smaller than or equal to 1 m.

8. The electrostatic-capacitance detection sensor according to claim 1,
wherein the sense electrode and the drive electrode are attached to a steering wheel, and
one of the sense electrode and the drive electrode is attached to a proximate side of the steering wheel, and the other electrode is attached to a distant side of the steering wheel.

9. The electrostatic-capacitance detection sensor according to claim 1, further comprising:
a drive-sense selecting unit configured to set one of the first electrode and the second electrode as the sense electrode, and to set the other electrode as the drive electrode,
wherein, when a difference between a value of the subtraction difference obtained in a state in which the first electrode is set as the sense electrode and the second electrode is set as the drive electrode, and a value of the subtraction difference obtained in a state in which the second electrode is set as the sense electrode and the first electrode is set as the drive electrode is smaller than or equal to a predetermined second threshold, the determining unit determines that a detection target is in close proximity to both of the first electrode and the second electrode.

10. The electrostatic-capacitance detection sensor according to claim 1, further comprising at least one third electrode, such that a plurality of the drive electrodes are provided.

11. The electrostatic-capacitance detection sensor according to claim 1,
wherein three or more electrodes including the first electrode and the second electrode are provided, and
the sense electrode and the drive electrode are selected from the three or more electrodes.

* * * * *